US 6,734,077 B2

(12) United States Patent
Förster et al.

(10) Patent No.: US 6,734,077 B2
(45) Date of Patent: May 11, 2004

(54) METHOD FOR FABRICATING A TRENCH CAPACITOR FOR A SEMICONDUCTOR MEMORY

(75) Inventors: Matthias Förster, Dresden (DE); Kristin Schupke, Dresden (DE); Anja Morgenschweis, Dresden (DE); Anett Moll, Dresden (DE); Jens-Uwe Sachse, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/234,547

(22) Filed: Sep. 4, 2002

(65) Prior Publication Data

US 2003/0068867 A1 Apr. 10, 2003

(30) Foreign Application Priority Data

Sep. 4, 2001 (DE) ............................. 101 43 283

(51) Int. Cl.⁷ .............................................. H01L 21/20
(52) U.S. Cl. .................... 438/386; 438/397; 438/398
(58) Field of Search ................. 438/386, 387, 438/389, 392, 396, 397, 398

(56) References Cited

U.S. PATENT DOCUMENTS

| 5,204,280 A | * | 4/1993 | Dhong et al. ............... 438/386 |
| 5,244,842 A | * | 9/1993 | Cathey et al. .............. 438/398 |
| 5,691,228 A | * | 11/1997 | Ping et al. ................. 438/255 |
| 5,760,434 A | * | 6/1998 | Zahurak et al. ............. 257/309 |
| 5,766,968 A | * | 6/1998 | Armacost et al. ........... 438/398 |
| 5,877,061 A | * | 3/1999 | Halle et al. ................ 438/386 |
| 6,033,967 A | * | 3/2000 | Li et al. .................... 438/398 |
| 6,090,301 A | * | 7/2000 | Mizukoshi et al. .......... 216/17 |
| 6,146,968 A | * | 11/2000 | Lu et al. .................... 438/398 |
| 6,159,874 A | * | 12/2000 | Tews et al. ................. 438/253 |
| 6,204,141 B1 | | 3/2001 | Lou |
| 6,294,423 B1 | * | 9/2001 | Malik et al. ................ 438/241 |
| 6,368,912 B1 | * | 4/2002 | Chang et al. ............... 438/248 |
| 6,455,369 B1 | * | 9/2002 | Forster et al. .............. 438/249 |
| 6,486,024 B1 | * | 11/2002 | Tews et al. ................. 438/249 |
| 6,559,005 B2 | * | 5/2003 | Gutsche et al. ............. 438/255 |

FOREIGN PATENT DOCUMENTS

| EP | 0 860 870 A2 | 8/1998 |
| WO | WO 99/25026 | 5/1999 |

* cited by examiner

*Primary Examiner*—Michael Trinh
*Assistant Examiner*—Khanh Duong
(74) *Attorney, Agent, or Firm*—Laurence A. Greenberg; Werner H. Stemer; Gregory L. Mayback

(57) ABSTRACT

A method for fabricating a trench capacitor for a semiconductor memory includes forming a masking layer in a trench that is disposed in a substrate. Nanocrystallites, which are used to pattern the masking layer, are deposited on the masking layer. Microtrenches are etched into the substrate in a lower region of the trench by the patterned masking layer. The microtrenches form a roughened trench sidewall. As a result, the outer capacitor electrode is formed with a larger surface area, allowing the trench capacitor to have a higher capacitance.

28 Claims, 6 Drawing Sheets

METHOD FOR FABRICATING A TRENCH CAPACITOR FOR A SEMICONDUCTOR MEMORY

BACKGROUND OF THE INVENTION

Field of the Invention

The invention relates to a method for fabricating a trench capacitor for a semiconductor memory.

Semiconductor memories, such as, for example, Dynamic Random Access Memories (DRAMs), include a cell array and driving peripherals. Memory cells are disposed in the cell array.

The cell array of a DRAM chip includes a matrix of memory cells disposed in the form of rows and columns and driven by word lines and bit lines. The reading of data from the memory cells or the writing of data to the memory cells is effected by the activation of suitable word lines and bit lines.

A memory cell of a DRAM usually includes a transistor that is connected to a capacitor. The transistor includes, inter alia, two doping regions that are separated from one another by a channel that is controlled by a gate. One doping region is referred to as a drain region and the other doping region is referred to as a source region.

One of the doping regions is connected to a bit line and the other of the doping regions is connected to a capacitor. The gate is connected to a word line. Applying suitable voltages to the gate controls the transistor such that a flow of current between the doping regions through the channel is switched on and off.

The integration density is increased by the ongoing miniaturization of memory components. The increase in the integration density means that the area that is available for each memory cell is constantly decreasing. Accordingly, the selection transistor and the storage capacitor of a memory cell are subject to a constant reduction in their geometric dimensions.

The ongoing attempts to reduce the size of the memory devices promote the construction of DRAMs with a high density and smaller characteristic size, i.e., smaller area per memory cell. Smaller components, such as, for example, smaller capacitors, are used to fabricate memory cells that require less surface area. The use of smaller capacitors, however, results in a lower storage capacitance on the part of the individual capacitor, which, in turn, may have an adverse effect on the operating ability and usability of the memory device.

By way of example, read amplifiers require a sufficient signal level to reliably read out the information that is stored in the memory cells. The ratio of the storage capacitance to the bit line capacitance is crucial in determining a sufficient signal level. If the storage capacitance is too low, the ratio may be too small to generate a sufficient signal to drive the read amplifier. Likewise, a lower storage capacitance requires a higher refresh frequency.

SUMMARY OF THE INVENTION

It is accordingly an object of the invention to provide a method for fabricating a trench capacitor for a semiconductor memory that overcomes the hereinafore-mentioned disadvantages of the heretofore-known devices of this general type and that increases the surface area of the electrodes of the trench capacitor.

With the foregoing and other objects in view, there is provided, in accordance with the invention, a method for fabricating a trench capacitor for a semiconductor memory, including the steps of providing a substrate having a substrate surface, forming at least one trench in the substrate surface, the trench having an upper region, a lower region, and a trench sidewall, introducing dopant through the trench sidewall in the lower region of the trench to form an outer capacitor electrode from a buried doping layer, forming a masking layer on the trench sidewall of the lower region of the trench, depositing nanocrystallites on the masking layer covering a first part of the masking layer and leaving clear a second part of the masking layer, etching the masking layer to uncover the trench sidewall with the nanocrystallites serving as an etching mask, the masking layer covered by the nanocrystallites remaining as a patterned mask layer on the trench sidewall, etching the substrate in the lower region of the trench utilizing the patterned mask layer to form microtrenches in the substrate and to roughen the trench sidewall, removing the patterned mask layer with an etch, forming an insulation layer on the roughened trench sidewall, depositing a conductive trench filling in the trench on the insulation layer as an inner capacitor electrode, and forming a selection transistor connected to the conductive trench filling to drive the trench capacitor.

With regard to the method, fabrication of a trench capacitor for a semiconductor memory includes the steps of:

providing a substrate having a substrate surface in which a trench, which has an upper region, a lower region, and a trench sidewall, is formed, introducing dopant through the trench sidewall in the lower region of the trench, a buried doping layer of increased dopant concentration being formed as an outer capacitor electrode;

forming a masking layer on the trench sidewall of the lower region of the trench;

depositing nanocrystallites on the masking layer so that the nanocrystallites cover a first part of the masking layer and leave clear a second part of the masking layer;

etching the masking layer, during which the trench sidewall is uncovered, the nanocrystallites serve as an etching mask, and the mask layer that is covered by the nanocrystallites remains as a patterned mask layer on the trench sidewall;

etching the substrate in the lower region of the trench using the patterned mask layer, during which microtrenches are formed in the substrate and a roughened trench sidewall is produced;

removing the patterned mask layer by an etch;

forming an insulation layer on the roughened trench sidewall;

depositing a conductive trench filling in the trenches on the insulation layer as an inner capacitor electrode; and forming a selection transistor that is connected to the conductive trench filling to drive the trench capacitor.

The method according to the invention roughens the trench sidewall in the lower region of the trench so that the surface area of the outer capacitor electrode of the trench capacitor is increased in size. According to the invention, for such a purpose, a mask layer is applied in the lower region of the trench and is patterned by deposited nanocrystallites. The patterned mask layer is then used as an etching mask for the etching of the trench sidewall in the lower region of the trench. Microtrenches are etched into the trench sidewall or substrate. The microtrenches in the substrate increase the surface area of the outer capacitor electrode. The enlarged outer capacitor electrode then allows a higher capacitance to be achieved in the trench capacitor or a constant capacitance to be achieved in the trench capacitor even when the geometric dimensions of the trench capacitor are reduced, for example, the surface area required at the substrate surface of the trench capacitor.

A trench capacitor that has been fabricated using the method has microtrenches in the trench sidewall of the lower region of the trench. The microtrenches are formed in the substrate, which is in single crystal form, and are used to increase the surface area of the outer capacitor electrode. The outer capacitor electrode is formed as a buried doping layer around the lower region of the trench, in the single-crystal substrate, as a highly doped layer. The enlarged surface area of the outer capacitor electrode makes it possible to achieve a higher capacitance for the trench capacitor according to the invention. As a result, the trench capacitor allows reliable operation of a memory cell. Increasing the size of the capacitor electrode by roughening also makes it possible to reduce the amount of the substrate surface area that is taken up by the trench capacitor as a result of the diameter of the trench being reduced, the trench capacitor in the trench retaining the same level of capacitance on account of the roughened outer capacitor electrode.

In accordance with another mode of the invention, an insulation collar is produced in the upper region of the trench, on the trench sidewall of the trench, before the trench sidewall is roughened in the lower region. The insulation collar formed in the upper region can be used to mask the trench sidewall in the upper region of the trench. The configuration has the advantage that the roughening of the trench sidewall is carried out only in the lower region of the trench. This, by way of example, avoids damage to the trench sidewall in the upper region. This prevents leakage currents that, by way of example, could preferentially flow along the roughened trench sidewall below the insulation collar.

In accordance with a further mode of the invention, the mask layer is formed with thermal oxidation or with thermal nitriding. Such a configuration has the advantage that the mask layer can be formed very conformly so that holes in the mask layer, which could disadvantageously roughen the trench sidewall, are avoided.

In accordance with an added mode of the invention, the mask layer is formed by LPCVD nitride deposition. LPCVD nitride deposition is also suitable for forming a thin and conformal mask layer in a structure with a high aspect ratio, such as, for example, the trench of the trench capacitor. In such a context, the term aspect ratio is understood as meaning the ratio between the trench depth and the trench diameter.

In accordance with an additional mode of the invention, the nanocrystallites are formed from silicon. The configuration has the advantage that the nanocrystallites used to pattern the mask layer are removed in the lower region of the trench together with the subsequent etching of the single-crystal substrate so that an additional etching step for removal of the nanocrystallites can be avoided.

In accordance with yet another mode of the invention, the masking layer is etched using dilute or, if appropriate, additionally buffered hydrofluoric acid or using phosphoric acid. Phosphoric acid has the advantage of acting highly selectively with respect to silicon oxide. As a result, there is scarcely any damage to the insulation collar.

In accordance with yet a further mode of the invention, the substrate is etched in the lower region of the trench together with the nanocrystallites in one etching step. Such a step advantageously avoids an additional etching step for removing the nanocrystallites from the patterned mask layer.

In accordance with yet an added mode of the invention, the patterned mask layer is removed using dilute hydrofluoric acid or using phosphoric acid.

In accordance with yet an additional mode of the invention, the dopant for the outer capacitor electrode is diffused out of a doped arsenic glass layer, which has been deposited in the trench, into the substrate. Such a step is advantageously suitable for forming the buried doping layer or the outer capacitor electrode. The method allows a high dopant concentration in the buried doping layer. As a result, the outer capacitor electrode has a low resistance.

In accordance with again another mode of the invention, the sidewall of the trench is roughened after the doping of the outer capacitor electrode. Such roughening has the advantage that the methods used to dope the outer capacitor electrode cannot damage the roughening of the sidewall because the sidewall is only roughened after the doping.

In accordance with again a further mode of the invention, the sidewall of the trench is roughened before the doping of the outer capacitor electrode. Because the surface has already been roughened prior to the doping of the outer capacitor electrode, the outer capacitor electrode can be formed with an increased dopant concentration as there is no subsequent removal of a doped silicon layer as a result of the roughening process. Furthermore, the microstructure of the roughened trench sidewall is, if appropriate, transferred to the dopant profile to improve the conformity of the dopant profile of the outer capacitor electrode with respect to the roughened trench sidewall.

In accordance with again an added mode of the invention, the dopant for the outer capacitor electrode is introduced into the substrate by arsenic vapor phase doping.

In accordance with again an additional mode of the invention, the lower region of the trench is widened by an etch so that the trench acquires a bottle shape. The bottle-shaped trench has the advantage of increasing the surface area of the outer capacitor electrode through the bottle shape. As a result, the trench capacitor can be formed with an increased capacitance.

In accordance with still another mode of the invention, the substrate is etched with an isotropic dry etch.

In accordance with still a further mode of the invention, the substrate is etched with an isotropic wet etch utilizing a mixture of hydrofluoric acid and nitric acid or a sequence including hydrofluoric acid and $NH_4OH/H_2O_2/H_2O$.

In accordance with still an additional feature of the invention, the substrate is etched with ammonium hydroxide.

In accordance with a concomitant mode of the invention, a selection transistor is connected to the conductive trench filling to drive the trench capacitor.

Other features that are considered as characteristic for the invention are set forth in the appended claims.

Although the invention is illustrated and described herein as embodied in a method for fabricating a trench capacitor for a semiconductor memory, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
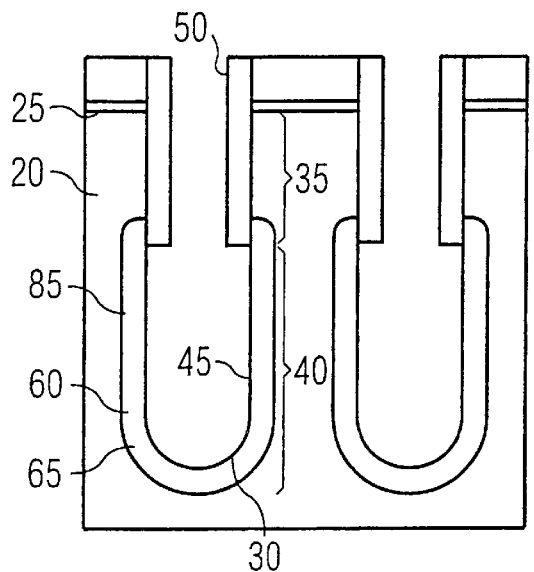
FIGS. 1 to 7 are fragmentary, cross-sectional views through a substrate illustrating sequential steps of a method according to the invention for roughening an outer capacitor electrode after a buried doping layer has been formed.

Referring now to the figures of the drawings in detail and first, particularly to FIG. 1 thereof, there is shown a sectional illustration through a substrate 20. The substrate 20 has a surface 25. A trench 30 has been introduced into the substrate 20 from the substrate surface 25. The trench 30 has an upper region 35 and a lower region 40, the upper region facing the substrate surface 25 and the lower region 40 adjoining the upper region 35. Furthermore, the trench 30 has a trench sidewall 45 that delimits the trench 30. In the upper region 35 of the trench 30, an insulation collar 50 is formed on the trench sidewall 45. In the lower region 40 of the trench 30, a buried doping layer 60 is disposed in the substrate 20, beyond the trench sidewall 45, as outer capacitor electrode 65. For such a purpose, an increased dopant concentration 85 in the substrate 20 is introduced into the substrate 20 around the lower region 40 of the trench 30.

Figure 2:
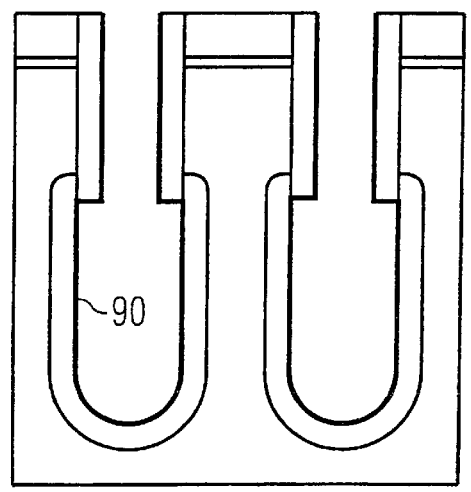

FIG. 2 shows the sectional illustration as shown in FIG. 1 in which a masking layer 90 has subsequently been formed in the lower region 40, on the trench sidewall 45 of the trench 30. The substrate 20 includes, for example, silicon, and the insulation collar 50 and the masking layer 90 include, for example, silicon oxide or silicon nitride. The masking layer 90 is formed by thermal oxidation, by thermal nitriding, or by Low Pressure Chemical Vapor Deposition (LPCVD). The masking layer 90 is formed, for example, with a thickness of between 0.3 and 10 nanometers.

Figure 3:
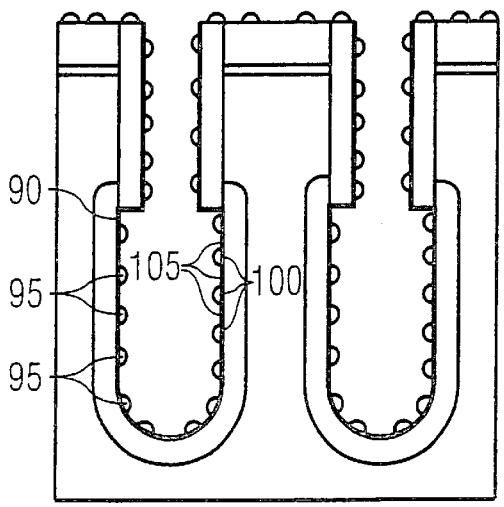

Referring now to FIG. 3, nanocrystallites 95 are then deposited on the masking layer 90. By way of example, an LPCVD step is suitable for such a purpose. The nanocrystallites 95 may, for example, be formed as silicon-containing crystallites with a lateral extent of between 5 nanometers and 100 nanometers. The free distance between adjacent nanocrystallites 95 is preferably of the same order of magnitude as their lateral extent. In such a case, the nanocrystallites 95 cover a first part 100 of the masking layer 90 and leave clear a second part 105 of the masking layer 90.

Figure 4:
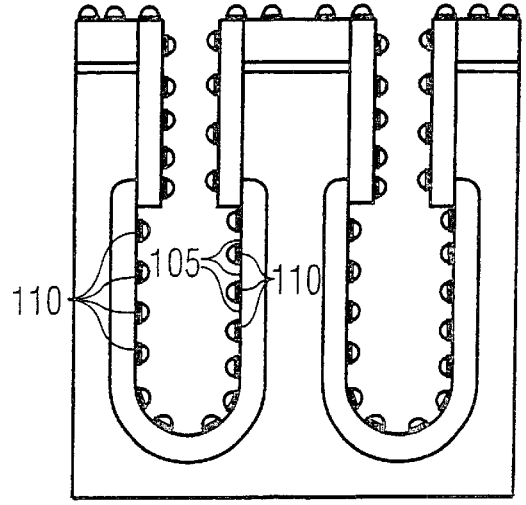

Referring now to FIG. 4, the masking layer 90 is patterned using the nanocrystallites 95 as etching mask. The first part of the masking layer 90, below the nanocrystallites 95, remains in place, and the second part 105 of the masking layer 90 is removed. If the nanocrystallites 95 are, for example, of silicon, the masking layer, which is of silicon nitride or silicon oxide, can be etched selectively with respect to the silicon of the nanocrystallites 95. By way of example, the masking layer 90 is etched by a wet chemical etch that contains hydrofluoric acid or phosphoric acid. Dry etching processes are also suitable.

Figure 5:
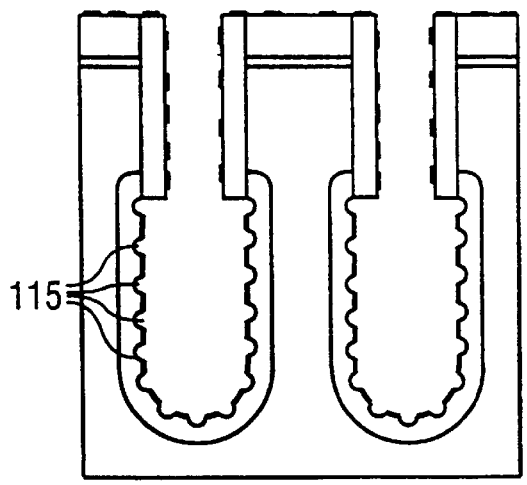

Referring now to FIG. 5, a wet chemical or dry chemical etch is then carried out, with the patterned masking layer 110 being used as the etching mask. During such a step, the substrate 20 is etched at the regions that are left clear by the patterned masking layer 110 and remains in place at the positions that are covered by the patterned mask layer 110.

Microtrenches 115 are etched into the substrate 20 by the etching of the lower region of the trench that is covered by the patterned mask layer 110. The nanocrystallites 95 used to pattern the mask layer 90 are, by way of example, removed at the same time as the patterning of the microtrenches 115.

The isotropic wet chemical etch may be carried out, for example, by a mixture of hydrofluoric acid and nitric acid. The ratio of HF to $HNO_3$ is, preferably, selected to be between 1 to 6 and 1 to 20, and the process temperature is, preferably, selected to be between 20° C. and 40° C.

Alternatively, it is possible to use a sequence including dilute hydrofluoric acid and $NH_4OH/H_2O_2/H_2O$ (SC1). In such a case, the ratio of $H_2O$ to HF is, preferably, selected to be between 100 to 1 and 500 to 1, and the process temperature is, preferably, selected to be between 20° C. and 30° C., and, then, the ratio of $H_2O$ to $NH_3$ to $H_2O_2$ is, preferably, selected to be between 5 to 1 to 1 and 100 to 1 to 2, and the process temperature is, preferably, selected to be between 50° C. and 70° C.

Anisotropic etching is also possible by a wet-chemical process, in which case the crystal orientations of the etched single-crystal substrate 20 are responsible for the anisotropy of the etching. By way of example, the etch, which is carried out anisotropically along the crystal orientations, can be carried out by ammonia solution or ammonium hydroxide. The ratio of $H_2O$ to $NH_3$ is, preferably, selected to be between 5 to 1 and 100 to 1, and the process temperature is, preferably, selected to be between 25° C. and 70° C.

The microtrenches 115 are, preferably, etched with a depth of between 5 and 50 nanometers.

Figure 6:
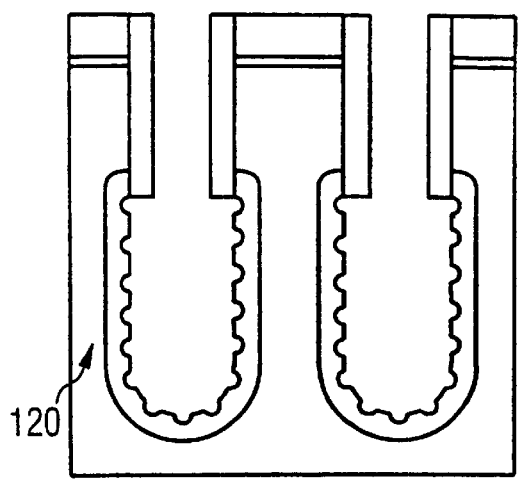

Referring now to FIG. 6, the masking layer 90 is subsequently removed by a wet chemical etch or a dry etch. By way of example, hydrofluoric acid or phosphoric acid are suitable for the wet chemical etch.

Figure 7:
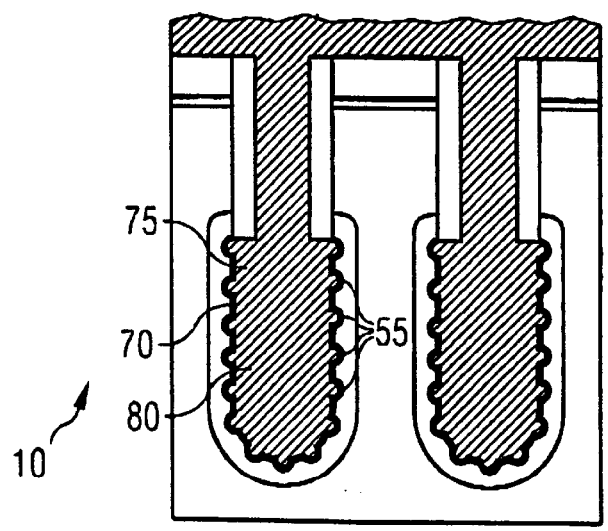

Then, referring now to FIG. 7, an insulation layer 70 is formed as capacitor dielectric on the roughened trench sidewall 120. By way of example, silicon nitride or silicon oxynitride is suitable as capacitor dielectric, and can be applied to the roughened trench sidewall in a thickness of, for example, 4 nanometers by LPCVD of silicon nitride. In a subsequent oxidation process, the silicon nitride layer that has been deposited is reoxidized.

Then, a conductive trench filling 75 is introduced into the trench 30 as inner capacitor electrode 80. In this case, the conductive trench filling 75 is formed, for example, from doped, polycrystalline silicon.

Figure 8:
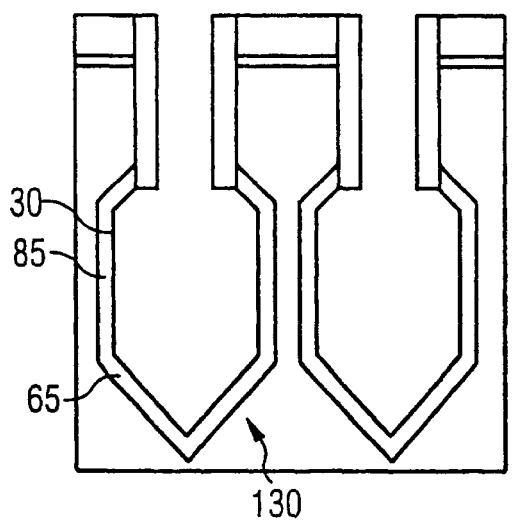
FIGS. 8 to 11 are fragmentary, cross-sectional views through the substrate of FIGS. 1 to 7 with the trench having been widened in a lower region to acquire a bottle shape in an alternative method according to the invention.

A further exemplary embodiment of the invention is described with reference to FIG. 8, in which, the trench 30 is widened in its lower region 40 by a wet chemical or dry chemical etch so that the trench 30 acquires a bottle shape. Then, the outer capacitor electrode 65 is introduced into the substrate 20 by dopant 85.

Figure 9:
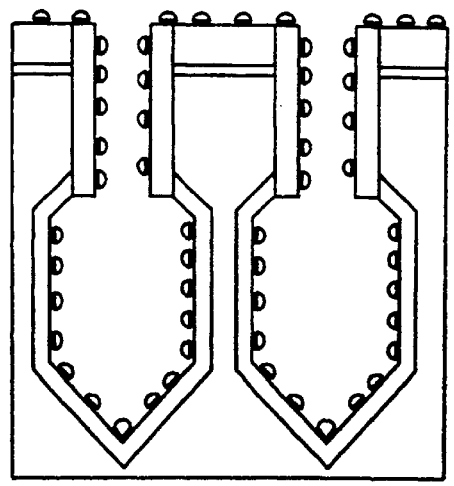
Figure 10:
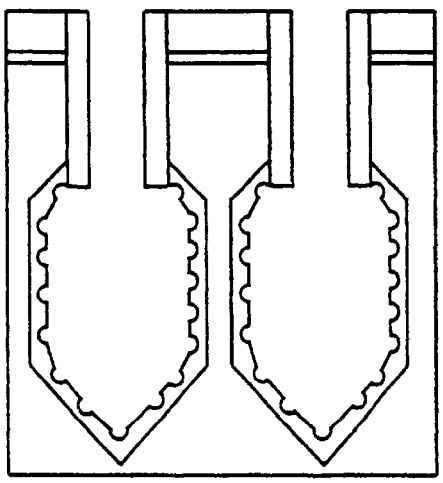
Figure 11:
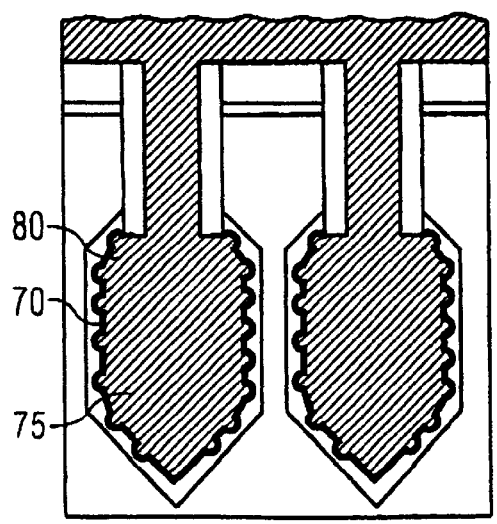

The method steps explained with reference to FIGS. 9, 10, and 11 correspond to those shown in FIGS. 2 to 7.

Figure 12:
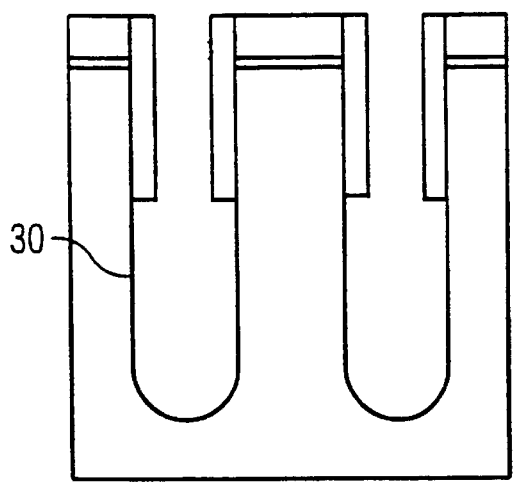
FIGS. 12 to 15 are fragmentary, cross-sectional views through the substrate of FIGS. 1 to 7 with the outer capacitor electrode being roughened before the buried doping layer is formed in a further method for fabricating a roughened outer capacitor electrode according to the invention.

FIG. 12 shows a third exemplary embodiment of the method according to the invention for fabricating a trench capacitor with roughened outer capacitor electrode 65. Unlike in FIG. 1, the buried doping layer 60 and, therefore, the outer capacitor electrode 65 have not yet been formed.

Figure 13:
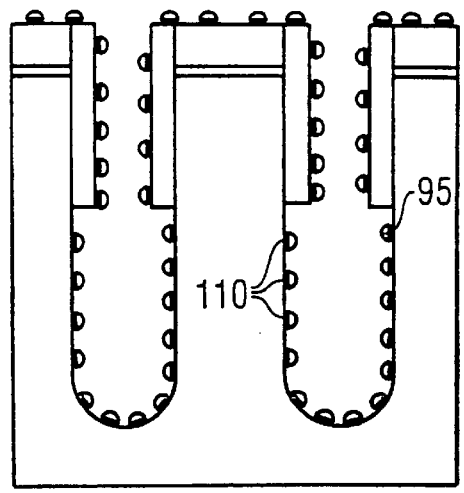

First of all, referring to FIG. 13, the patterned mask layer 110 is fabricated by the nanocrystallites 95 using the method steps described in connection with FIGS. 2, 3, 4, 5, and 6.

Figure 14:
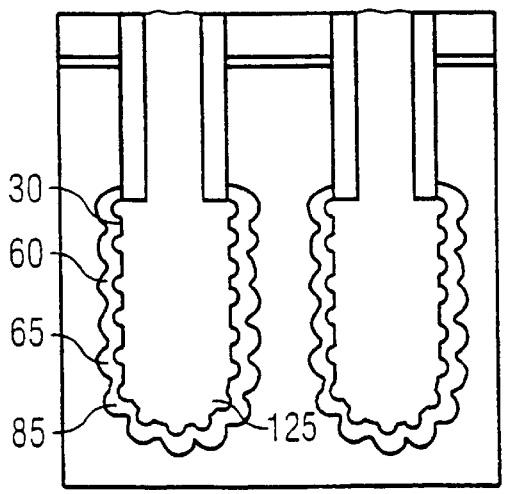

Then, referring to FIG. 14, the buried doping layer 60 is formed as outer capacitor electrode 65. This is possible, for example, by the deposition of an arsenic glass layer 125 in the trench 30. Then, in a heat-treatment step, the arsenic dopant is diffused out of the arsenic glass layer 125 and forms the buried doping layer 60 in the substrate 20. The arsenic glass layer 125 is then removed from the trench 30.

An alternative for the fabrication of the buried doping layer provides for vapor phase doping with arsine ($AsH_3$) to be carried out. In such a case, arsine is introduced into the trench 30 and arsenic diffuses into the substrate 20 so that the buried doping layer 60 is formed as outer capacitor electrode 65.

Figure 15:
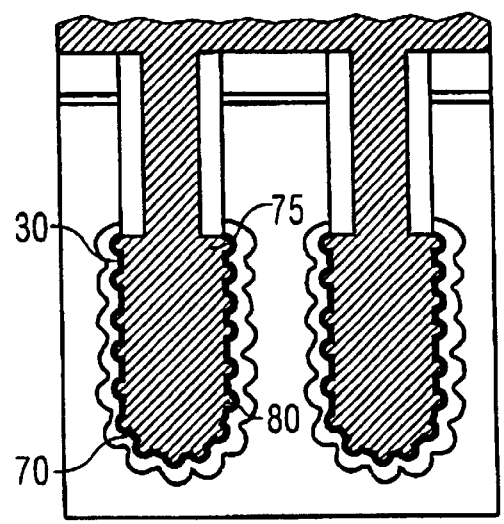
Figure 16:
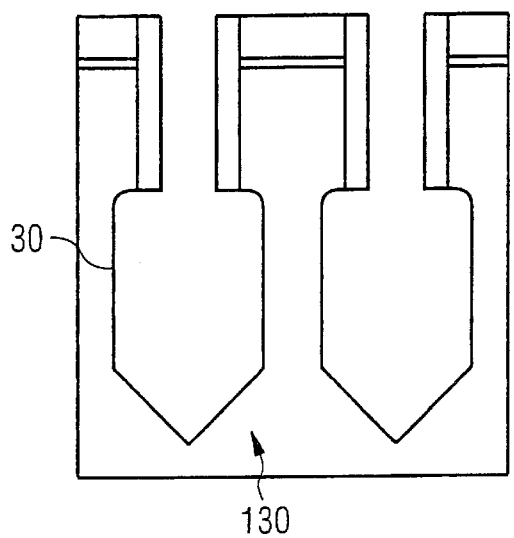
FIGS. 16 to 20 are fragmentary, cross-sectional views through the substrate of FIGS. 1 to 7 with the trench additionally having been widened in the lower region to acquire a bottle shape corresponding to the method illustrated in FIGS. 12 to 15.
Figure 17:
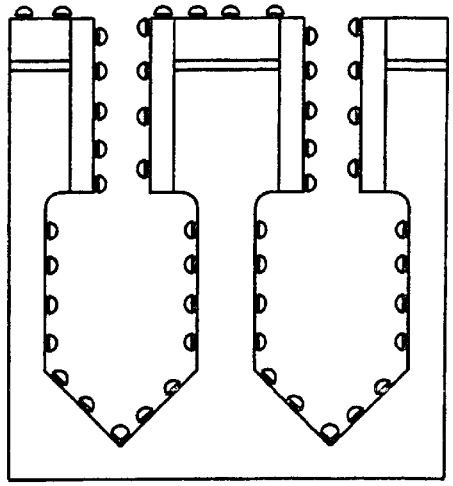
Figure 18:
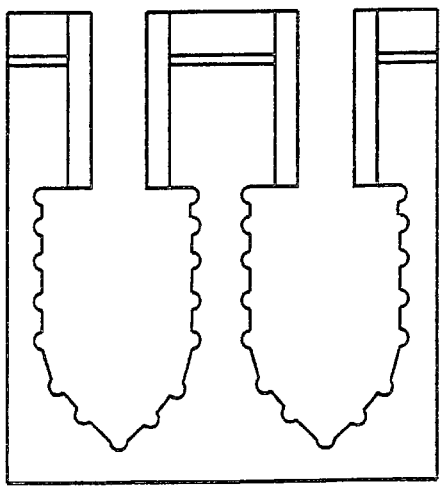
Figure 19:
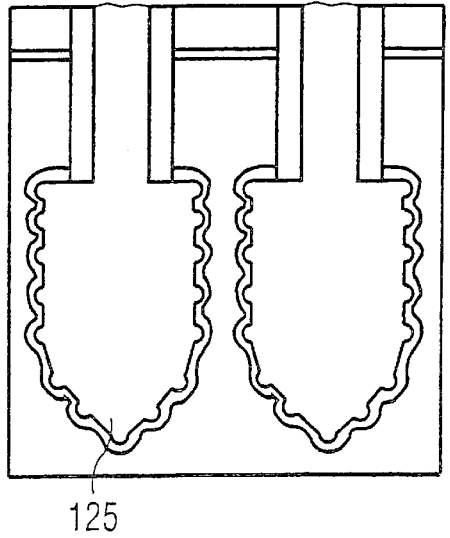
Figure 20:
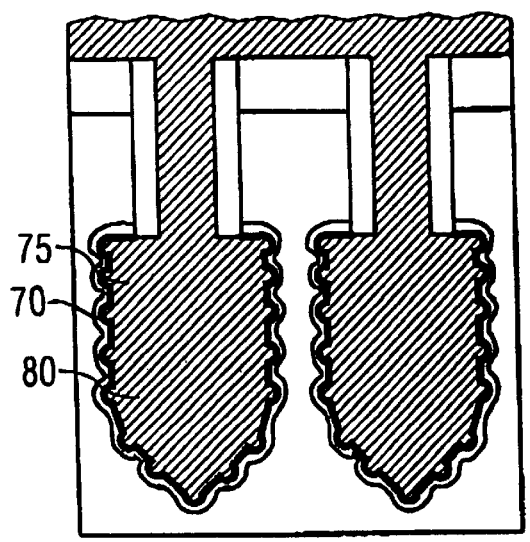

Then, referring to FIG. 15, the insulation layer 70 as capacitor dielectric and the conductive trench filling 75 as inner capacitor electrode 80 are formed in the trench 30.

FIGS. 16 to 20 illustrate a further exemplary embodiment. Unlike in the method that has been explained in FIGS. 12 to 15, in FIG. 16, first of all, the lower region 40 of the trench 30 is widened so that the trench 30 is formed with a bottle shape. Then, the process steps shown in FIGS. 17 to 20 are carried out in the same way as in FIGS. 13 to 15.

Figure 21:
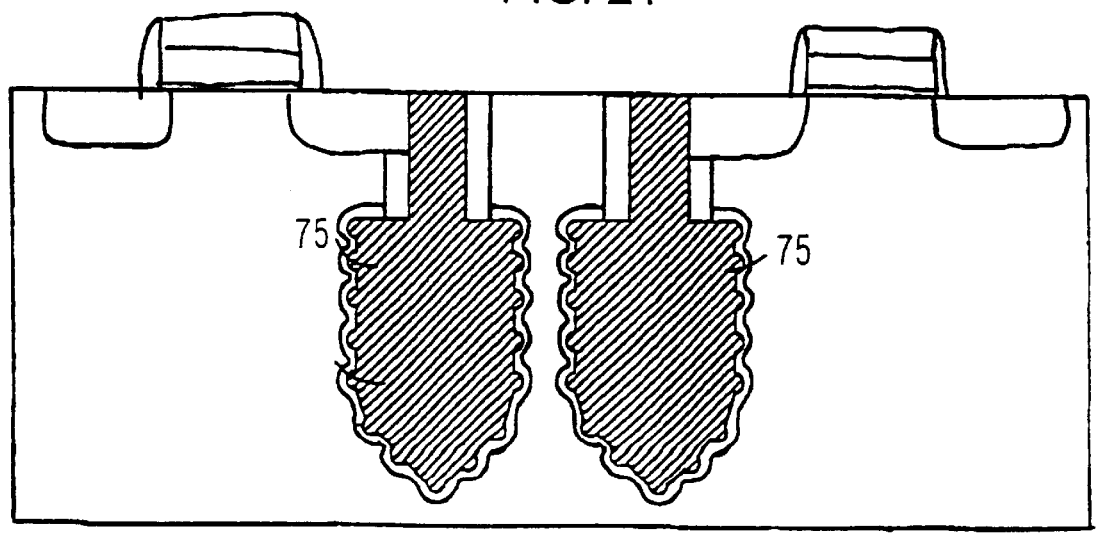
FIG. 21 is a fragmentary, cross-sectional view through the substrate of FIGS. 1 to 7 with the widened trenches of FIGS. 16 to 20 and transistors connected thereto.

FIG. 21 illustrates the widened trenches of FIGS. 16 to 20 and transistors connected to the trenches. For example, the planar transistors can be MOSFETs with one source/drain region connected to a respective trench filling 75.

We claim:

1. A method for fabricating a trench capacitor for a semiconductor memory, which comprises:
    providing a substrate having a substrate surface;
    forming at least one trench in the substrate surface, the trench having an upper region, a lower region, and a trench sidewall;
    introducing dopant through the trench sidewall in the lower region of the trench to form an outer capacitor electrode from a buried doping layer;
    forming a masking layer on the trench sidewall of the lower region of the trench;
    depositing nanocrystallites on the masking layer covering a first part of the masking layer and leaving clear a second part of the masking layer;
    etching the masking layer to uncover the trench sidewall with the nanocrystallites serving as an etching mask, the masking layer covered by the nanocrystallites remaining as a patterned mask layer on the trench sidewall;
    etching the substrate in the lower region of the trench utilizing the patterned mask layer to form microtrenches in the substrate and to roughen the trench sidewall;
    removing the patterned mask layer with an etch;
    forming an insulation layer on the roughened trench sidewall; and
    depositing a conductive trench filling in the trench on the insulation layer as an inner capacitor electrode.

2. The method according to claim 1, which further comprises producing an insulation collar in the upper region of the trench on the trench sidewall before the trench sidewall is roughened in the lower region.

3. The method according to claim 1, which further comprises forming the masking layer with one of the group consisting of thermal oxidation and thermal nitriding.

4. The method according to claim 1, which further comprises forming the masking layer by LPCVD nitride deposition.

5. The method according to claim 1, which further comprises forming the nanocrystallites from silicon.

6. The method according to claim 1, wherein the nanocrystallites are of silicon.

7. The method according to claim 1, which further comprises etching the masking layer with one of the group consisting of dilute hydrofluoric acid and phosphoric acid.

8. The method according to claim 1, which further comprises carrying out the masking layer etching step with one of the group consisting of dilute hydrofluoric acid and phosphoric acid.

9. The method according to claim 1, which further comprises etching the substrate in the lower region of the trench together with the nanocrystallites in one etching step.

10. The method according to claim 1, which further comprises carrying out the substrate etching step together with the nanocrystallites in one etching step.

11. The method according to claim 1, which further comprises removing the patterned mask layer with one of the group consisting of dilute hydrofluoric acid and phosphoric acid.

12. The method according to claim 1, which further comprises carrying out the patterned mask layer removing step with one of the group consisting of dilute hydrofluoric acid and phosphoric acid.

13. The method according to claim 1, which further comprises depositing a doped arsenic glass layer in the trench and diffusing the dopant for the outer capacitor electrode into the substrate from the doped arsenic glass layer.

14. The method according to claim 1, which further comprises carrying out the dopant introduction step by depositing a doped arsenic glass layer in the trench and diffusing the dopant for the outer capacitor electrode into the substrate from the doped arsenic glass layer.

15. The method according to claim 1, which further comprises introducing the dopant for the outer capacitor electrode into the substrate by arsenic vapor phase doping.

16. The method according to claim 1, which further comprises carrying out the dopant introduction step by arsenic vapor phase doping.

17. The method according to claim 1, which further comprises roughening the trench sidewall after the forming of the outer capacitor electrode.

18. The method according to claim 1, which further comprises roughening the trench sidewall before the forming of the outer capacitor electrode.

19. The method according to claim 1, which further comprises widening the lower region of the trench with an etch to give the trench a bottle shape.

20. The method according to claim 1, which further comprises etching the lower region of the trench to form the trench into an approximate bottle shape.

21. The method according to claim 1, which further comprises carrying out the lower region etching step to form the trench into an approximate bottle shape.

22. The method according to claim 1, which further comprises etching the substrate with an isotropic dry etch.

23. The method according to claim 1, which further comprises carrying out the substrate etching step with an isotropic dry etch.

24. The method according to claim 1, which further comprises etching the substrate with an isotropic wet etch utilizing one of:

a mixture of hydrofluoric acid and nitric acid; and a sequence including hydrofluoric acid and $NH_4OH/H_2O_2/H_2O$.

25. The method according to claim 1, which further comprises carrying out the substrate etching step with an isotropic wet etch utilizing one of:

a mixture of hydrofluoric acid and nitric acid; and a sequence including hydrofluoric acid and $NH_4OH/H_2O_2/H_2O$.

26. The method according to claim 1, which further comprises etching the substrate with ammonium hydroxide.

27. The method according to claim 1, which further comprises carrying out the substrate etching step with ammonium hydroxide.

28. The method according to claim 1, which further comprises forming a selection transistor connected to the conductive trench filling to drive the trench capacitor.

* * * * *